(12) United States Patent
Lee

(10) Patent No.: US 6,239,461 B1
(45) Date of Patent: May 29, 2001

(54) SEMICONDUCTOR DEVICE CAPACITOR HAVING A RECESSED CONTACT PLUG

(75) Inventor: Byoung-taek Lee, Seoul (KR)

(73) Assignee: Samsung Electronics Co., Ltd., Kyungki-do (KR)

( * ) Notice: Subject to any disclaimer, the term of this patent is extended or adjusted under 35 U.S.C. 154(b) by 0 days.

(21) Appl. No.: 09/245,777

(22) Filed: Feb. 5, 1999

(30) Foreign Application Priority Data

Oct. 16, 1998 (KR) .................................................. 98-43354

(51) Int. Cl.[7] .................................................. H01L 27/108
(52) U.S. Cl. .......................................... 257/306; 257/310
(58) Field of Search .................................... 257/306, 310, 257/532

(56) References Cited

U.S. PATENT DOCUMENTS 5,392,189 * 2/1995 Fazan et al. ........................ 257/310

* cited by examiner

Primary Examiner—Mark V. Prenty

(74) Attorney, Agent, or Firm—Skjerven Morrill MacPherson LLP; David W. Heid

(57) ABSTRACT

A capacitor of a semiconductor device includes a first interlayer dielectric film pattern formed on a semiconductor substrate and having a first contact hole therein and a contact plug buried in the first contact hole and electrically connected to the semiconductor substrate. A diffusion barrier layer pattern is formed on the contact plug, and a first conductive film pattern is formed on the diffusion barrier layer pattern for preventing the oxidization of the diffusion barrier layer pattern. A second interlayer dielectric pattern having a second contact hole exposing the surface of the first conductive film pattern is formed on the first interlayer dielectric film pattern and the first conductive film pattern. A second conductive film pattern used as the lower electrode of a capacitor is buried in the second contact hole and connected to the first conductive film pattern. A high dielectric film and a third conductive film pattern used as the upper electrode of the capacitor are sequentially formed so as to surround the second conductive film pattern. The first conductive film pattern is formed of a platinum group metal or a conductive oxide including the platinum group metal. According to the present invention, it is possible to prevent the increase of a contact resistance since the first conductive pattern prevents diffusion barrier layer pattern from oxidizing.

11 Claims, 5 Drawing Sheets

SEMICONDUCTOR DEVICE CAPACITOR HAVING A RECESSED CONTACT PLUG

BACKGROUND OF THE INVENTION

1. Field of the Invention

The present invention relates to a semiconductor device and a method for manufacturing the same, and more particularly, to a capacitor of a semiconductor device including a dielectric film of high dielectric constant (a high dielectric film) and a method for manufacturing the same.

2. Description of the Related Art

As an integration density of a semiconductor device such as a dynamic random access memory (DRAM) and a ferro-electric RAM (FRAM) increases, a high dielectric constant material such as $PbZrTiO_3$ (PZT) or $BaSrTiO_3$ (BST) is required for the dielectric film of a capacitor. Metals of the platinum group and the oxides thereof are mainly used for the conductive film forming a lower electrode or an upper electrode in a capacitor using the high dielectric film. Here, a dry etching for patterning the platinum group metals and the oxide thereof used for the conductive film of the capacitor is difficult. Also, since the platinum group and the oxide thereof reacts with a polysilicon film used as a contact plug, a diffusion barrier layer for preventing the reaction is required between the conductive film and the polysilicon film.

FIG. 1 is a sectional view for describing the capacitor of the semiconductor device according to a conventional technology.

To be specific, an interlayer dielectric film 3 having a contact hole is formed on a semiconductor substrate 1. A contact plug 5 comprised of the polysilicon film is buried in the contact hole. A diffusion barrier layer 7 connected to the contact plug 5 and comprised of Ta is formed. A first conductive film 9 used as the lower electrode of the capacitor and comprised of Pt is formed on the diffusion barrier layer 7. A high dielectric film 11 is formed on the overall surface of the semiconductor substrate 1 on which the first conductive material 9 is formed. A second conductive material 13 used as an upper electrode is formed on the overall surface of the semiconductor substrate 1 on which the high dielectric film 11 is formed.

In a conventional capacitor shown in FIG. 1, the diffusion barrier layer 7 is formed in order to prevent the reaction between the platinum film of the first conductive film 9 and the contact plug 5. In the conventional capacitor shown in FIG. 1, since the side surfaces of the platinum film of the first conductive film 9 and the diffusion barrier layer 7 are exposed during the deposition of the dielectric film 11 and in a subsequent heat treatment process, the diffusion barrier layer 7 is oxidized and thus becoming $Ta_2O_5$ which is a non-conductor. Accordingly, the contact resistance of the first conductive film 9 increases and the first conductive film 9 cannot be used. Also, in the conventional capacitor shown in FIG. 1, leakage current increases since the diffusion barrier layer 7 reacts with the high dielectric film 11.

A method of recessing the contact plug is proposed in order to solve the above problem, which is described with reference to FIGS. 2 and 3.

FIGS. 2 and 3 are sectional views showing the capacitors of the semiconductor device according to another conventional technology.

Referring to FIGS. 2 and 3, an interlayer dielectric film 23 having a contact hole is formed on a semiconductor substrate 21. A silicon plug 25 and a diffusion barrier layer 27 comprised of Ta film are sequentially buried in the contact hole. A first conductive film 29 used as the lower electrode of the capacitor and comprised of Pt film is formed on the diffusion barrier layer 27.

In the conventional capacitor shown in FIG. 2, the diffusion barrier layer 27 is formed in a position different from that of the diffusion barrier layer 7 of FIG. 1. Namely, since the diffusion barrier layer 27 is buried in the contact hole, it is possible to prevent the side surface of the diffusion barrier layer 27 from being exposed.

However, in the conventional capacitor shown in FIG. 2, the diffusion path of an oxygen atom is short, and thus the diffusion barrier layer 27 may be oxidized during a subsequent process of forming the high dielectric film.

Furthermore, as shown in FIG. 3, when a misalignment occurs during patterning for forming the first conductive film 29, the diffusion barrier layer 27 is exposed and oxidized during the subsequent process of depositing the high dielectric film and becomes a nonconductor. When the diffusion barrier layer 27 becomes nonconductive, the contact resistance of the conductive film 29 is increased and the production yield of the semiconductor device is deteriorated.

SUMMARY OF THE INVENTION

Accordingly, it is an object of the present invention to provide a capacitor of a semiconductor device in which it is possible to prevent a contact resistance from increasing by preventing the oxidization of a diffusion barrier layer in employing a high dielectric film.

It is another object of the present invention to provide a method for manufacturing the capacitor of the above semiconductor device.

To achieve the first object, a capacitor of a semiconductor device includes a first interlayer dielectric film pattern formed on a semiconductor substrate and having a first contact hole therein and a contact plug buried in the first contact hole and electrically connected to the semiconductor substrate. A diffusion barrier layer pattern is formed on the contact plug, and a first conductive film pattern is formed on the diffusion barrier layer pattern for preventing the oxidization of the diffusion barrier layer pattern. A second interlayer dielectric film pattern having a second contact hole exposing the surface of the first conductive film pattern is formed on the first interlayer dielectric film pattern and the first conductive film pattern. A second conductive film pattern used as the lower electrode of a capacitor is buried in the second contact hole and connected to the first conductive film pattern. A high dielectric film and a third conductive film pattern used as the upper electrode of the capacitor are sequentially formed on the second conductive film pattern.

The diffusion barrier layer pattern can be formed of Ta, Ti, W, Co, Ir, Ru, TaSi, CoSi, $TiSi_x$, WSi, TiSiN, TaSiN, $IrO_2$, $RuO_2$, WN, TiN, TaN, TaAlN, or TiAlN. The first conductive film pattern can be formed of a platinum group metal or a conductive oxide including the platinum group metal. The contact plug can be formed of a polysilicon film, a silicon film, a tungsten film, a tungsten nitride film, or a titanium nitride film.

In accordance with an embodiment of the present invention, a capacitor of a semiconductor device includes a first interlayer dielectric film pattern formed on a semiconductor substrate and having a first contact hole therein and a contact plug buried in the first contact hole and electrically connected to the semiconductor substrate. A diffusion barrier layer pattern is formed on the contact plug, and a first conductive film pattern is formed on the diffusion barrier layer pattern for preventing the oxidization of the diffusion layer pattern. A second interlayer dielectric film pattern having a second contact hole for exposing the surface of the first conductive film pattern is formed on the first interlayer dielectric film pattern and the first conductive film pattern. A second conductive film pattern used as the lower electrode of the capacitor is formed on the inner wall of the second contact hole and on the first conductive film pattern. A high dielectric film and a third conductive film pattern used as the upper electrode are sequentially formed on the second conductive film pattern and the second interlayer dielectric film pattern.

To achieve the second object, a method for manufacturing a capacitor of a semiconductor device includes the step of forming a first interlayer dielectric film pattern having a first contact hole for exposing the surface of a semiconductor substrate on the semiconductor substrate. Then, a contact plug buried in the first contact hole and electrically connected to the semiconductor substrate is formed. A diffusion barrier layer pattern and a first conductive film pattern for exposing the surface of the first interlayer dielectric film pattern are sequentially formed on the contact plug. A second interlayer dielectric film pattern having a second contact hole for exposing the surface of the first conductive film pattern is formed on the first interlayer dielectric film pattern and the first conductive film pattern. A second conductive film pattern used as the lower electrode of a capacitor is formed on the first conductive film pattern. A high dielectric film and a third conductive film pattern used as the upper electrode of a capacitor are sequentially formed on the second conductive film pattern.

The forming of contact plug is achieved by the steps of forming a conductive film on a substrate in which the first contact hole and the first interlayer dielectric film pattern are formed; and etching back or performing a CMP process on the conductive film. The diffusion barrier layer pattern can be formed of Ta, Ti, W, Co, Ir, Ru, TaSi, CoSi, TiSi$_x$, WSi, TiSiN, TaSiN, IrO$_2$, RuO$_2$, WN, TiN, TaN, TaAlN, or TiAlN. The first conductive film pattern can be formed of a platinum group metal or a conductive oxide conductor including the platinum group metal.

In accordance with an embodiment of the present invention, a method for manufacturing a capacitor of a semiconductor device includes the step of forming a first interlayer dielectric film pattern having a first contact hole for exposing the surface of a semiconductor substrate. Next, a contact plug buried in the first contact hole and electrically connected to the semiconductor substrate is formed. A diffusion barrier layer pattern and a first conductive film pattern for exposing the first interlayer dielectric film pattern are sequentially formed on the contact plug. A second interlayer dielectric film pattern having a second contact hole for exposing the surface of the first conductive film pattern is formed on the first interlayer dielectric film pattern and the first conductive film pattern. A second conductive film pattern used as the lower electrode of the capacitor is formed on the inner wall of the second contact hole and on the surface of the first conductive film pattern. A high dielectric film and a third conductive film pattern used as the upper electrode of the capacitor are sequentially formed on the second conductive film pattern.

The forming of second conductive film pattern is achieved by the steps of forming a conductive film on the overall surface of the resultant in which the second contact hole is formed, forming a material film on the overall surface of the resultant on which the conductive film is formed so as to bury the second contact hole, etching back or performing a CMP process on the material film and the conductive film so as to expose the second interlayer dielectric film pattern, and removing a material film left in the second contact hole.

The material film can be formed of a photoresist film or an insulting film. The forming of second conductive film pattern is achieved by the steps of forming a conductive film on the overall surface of the resultant in which the second contact hole is formed, and performing a CMP process on the conductive film so as to expose the second interlayer dielectric film pattern.

According to the present invention, the diffusion barrier layer pattern is not oxidized since it is formed under the first conductive film pattern. Accordingly, it is possible to prevent the increase of the contact resistance.

BRIEF DESCRIPTION OF THE DRAWINGS

The above objects and advantages of the present invention will become more apparent by describing in detail specific embodiment thereof with reference to the attached drawings in which.

DESCRIPTION OF THE PREFERRED EMBODIMENTS

Figure 1:
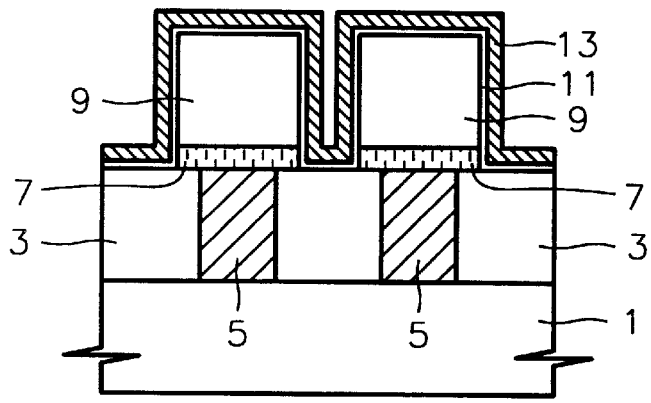
FIG. 1 is a sectional view of a capacitor of a semiconductor device according to a conventional technology.
Figure 2:
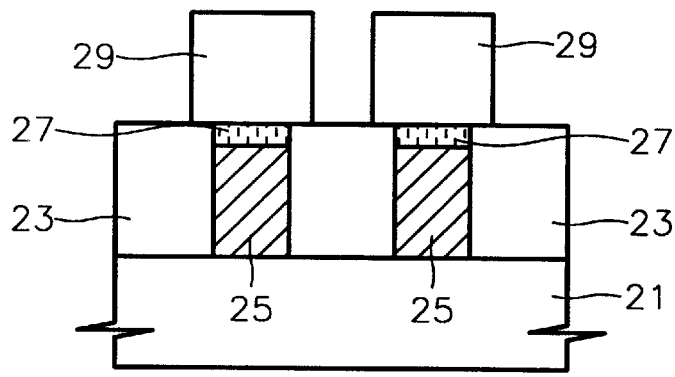
FIGS. 2 and 3 are sectional views of capacitors of semiconductor devices according to another conventional technology.
Figure 3:
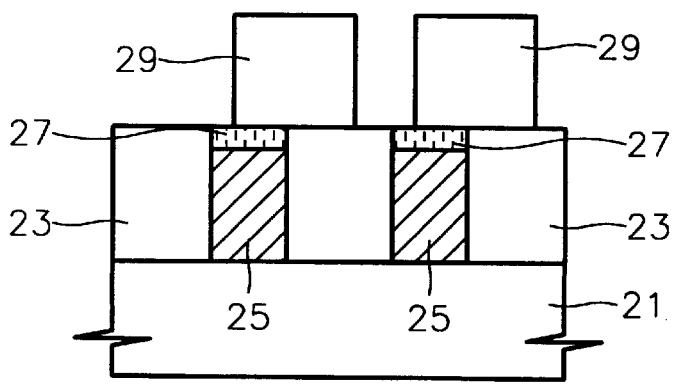
Figure 4:
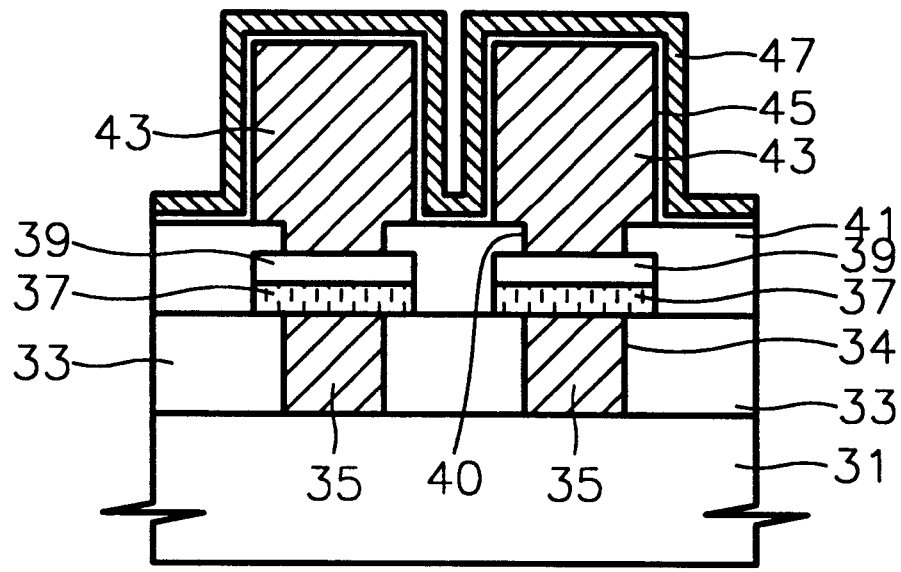
FIG. 4 is a sectional view of a capacitor of a semiconductor device according to an embodiment of the present invention.

FIG. 4 is a sectional view of a capacitor of a semiconductor device according to an embodiment of the present invention.

To be specific, a first interlayer dielectric film pattern 33 having a first contact hole 34 therethrough is formed on a semiconductor substrate 31, for example, a silicon substrate. A contact plug 35 electrically connected to the semiconductor substrate 31 is formed in the first contact hole 34. The contact plug 35 is comprised of a polysilicon film, a silicon film, a tungsten film, a tungsten nitride film, or a titanium nitride film. A diffusion barrier layer pattern 37 and a first conductive film pattern 39 are sequentially formed on the contact plug 35 and the first interlayer dielectric film pattern 33 so as to be connected to the contact plug 35. The first conductive film pattern 39 is formed to prevent the diffusion barrier layer pattern 37 from being oxidized. The diffusion barrier layer pattern 37 is formed of Ta, Ti, W, Co, Ir, Ru, TaSi, CoSi, TiSi$_x$, WSi, TiSiN, TaSiN, IrO$_2$, RuO$_2$, WN, TiN, TaN, TaAlN, or TaAlN. The first conductive film pattern 39 is comprised of a platinum group metal such as Pt, Ru, or Ir, a platinum group oxide conductor such as IrO$_2$ or RuO$_2$, or a conductive oxide conductor including the platinum group metal and having a perovskite structure, such as SrRuO$_3$, CaSrRuO$_3$, or BaSrRuO$_3$.

A second interlayer dielectric film pattern 41 having a second contact hole 40 for exposing the surface of the first conductive film pattern 39 is formed on the first interlayer dielectric film pattern 33 and the first conductive film pattern 39. A second conductive film pattern 43 used as the lower electrode of the capacitor is formed to be buried in the second contact hole 40 and connected to the first conductive film pattern 39. A high dielectric film 45 is formed on the second conductive film pattern 43. The high dielectric film 45 is comprised of $Al_2O_3$, $Ta_2O_5$, $(Ba,Sr)TiO_3$, $BaTiO_3$, $SrTiO_3$, $PbTiO_3$, $Pb(Zr,Ti)O_3$, $(Pb,La)TiO_3$, $KNO_3$, or $LiNbO_3$. A third conductive film pattern 47 used as the upper electrode of the capacitor is formed on the high dielectric film 45. The second conductive film pattern 43 and the third conductive film pattern 47 are comprised of a platinum group metal such as Pt, Ru, and Ir, a platinum group oxide conductor such as $IrO_2$ and $RuO_2$, or an oxide conductor including the platinum group metal and having a perovskite structure, such as $SrRuO_3$, $CaSrRuO_3$, and $BaSrRuO_3$, respectively.

In particular, since the diffusion barrier layer pattern 37 is buried under the first conductive film pattern 39 in the capacitor of the semiconductor device according to the present invention shown in FIG. 4, it is not exposed during the formation of the high dielectric film 45 and the subsequent heat treatment.

Furthermore, in the capacitor of the semiconductor device according to the present invention shown in FIG. 4, it is possible to control the diffusion path of oxygen atoms by controlling the height (the thickness) of the first conductive film pattern 39 formed on the diffusion barrier layer pattern 37. Therefore, it is not required to increase the height (the thickness) of the second contact hole 40 formed in the second interlayer dielectric film pattern 41. In this case, in a highly integrated semiconductor device, it is possible to form the second conductive film such as the platinum group metal and the oxide thereof in the second contact hole 40 not by a CVD (chemical vapor deposition) method which has a high process cost and is not well developed but by a sputtering method. As a result, the capacitor of the semiconductor device according to the present invention prevents the oxidization of the diffusion barrier layer pattern 37 and reduces a contact resistance.

Figure 5:
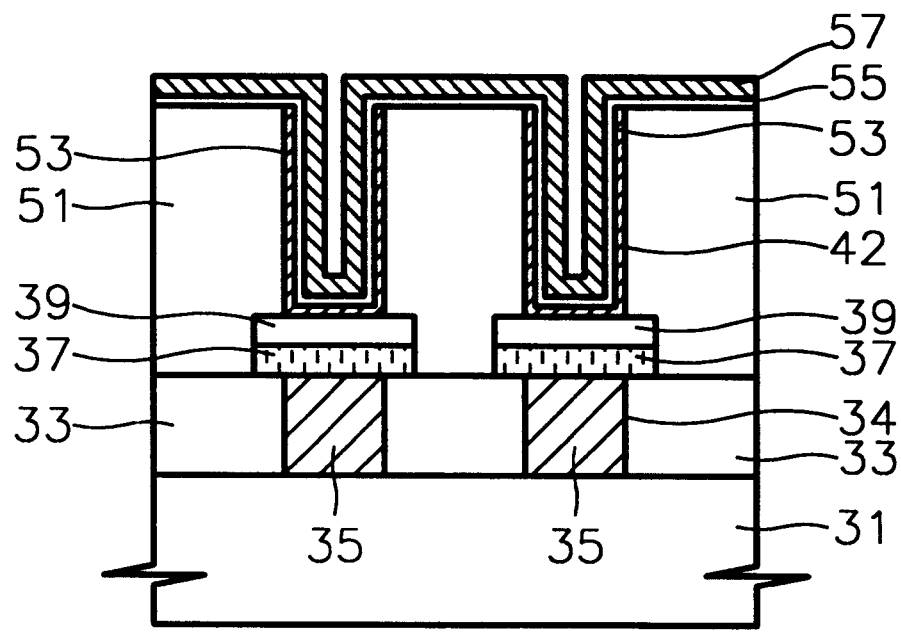
FIG. 5 is a sectional view of a capacitor of a semiconductor device according to another embodiment of the present invention.

FIG. 5 is a sectional view of a capacitor of a semiconductor device according to a second embodiment of the present invention. In FIG. 5, reference numerals identical to those of FIG. 4 denote identical members.

To be specific, in the capacitor of the semiconductor device according to the second embodiment of the present invention, as shown in FIG. 4, the first interlayer dielectric film pattern 33 having a first contact hole 34, a contact plug 35 buried in the first contact hole 43, the diffusion barrier layer pattern 37, and the first conductive film pattern 39 are formed on the semiconductor substrate 31. The height (the thickness) of a second interlayer dielectric film pattern 51 having the second contact hole 42 exposing the first conductive film pattern 39 is formed to be high. The second conductive film pattern 53 used as the lower electrode of the capacitor is formed on the inner wall of the second contact hole 42 and on the first conductive film pattern 39. A high dielectric film 55 and a third conductive film pattern 57 used as the upper electrode are formed on the second conductive film pattern 53. The second conductive film pattern 53 and the third conductive film pattern 57 are comprised of a conductive platinum group metal such as Pt, Ru, or Ir, a platinum group oxide such as $IrO_2$ or $RuO_2$, or a conductive oxide including the platinum group metal and having a perovskite structure, such as $SrRuO_3$, $CaSrRuO_3$, or $BaSrRuO_3$. A high dielectric film 55 is comprised of $Al_2O_3$, $Ta_2O_5$, $(Ba,Sr)TiO_3$, $BaTiO_3$, $SrTiO_3$, $PbTiO_3$, $Pb(Zr,Ti)O_3$, $(Pb,La)TiO_3$, $KNO_3$, or $LiNbO_3$.

In particular, in the capacitor of the semiconductor device according to the embodiment of the present invention shown in FIG. 5, the diffusion barrier layer pattern 37 is not exposed during the formation of the high dielectric film 45 and the subsequent process of heat treatment since it is buried under the first conductive film pattern 39 like in FIG. 4, and an oxygen diffusion path is long due to the first conductive film pattern 39.

In the capacitor of the semiconductor device according to the second embodiment of the present invention shown in FIG. 5, the second interlayer dielectric film pattern 51 is higher than that of FIG. 4. The second conductive film pattern 53 used as the lower electrode is not formed by a dry etching process but by a CMP (chemical mechanical polishing) method or an etch back method. When the second conductive film pattern 43 (FIG. 4) used as the lower electrode comprised of the platinum group metal or the oxide thereof becomes higher since the semiconductor device is highly integrated, it is not possible to form the second conductive film pattern having a height of at least 300 nm under 0.3 um pitch.

FIGS. 6 through 10 are sectional views of a semiconductor device for describing a method for manufacturing a capacitor of the semiconductor device according to the present invention shown in FIG. 4.

Figure 6:
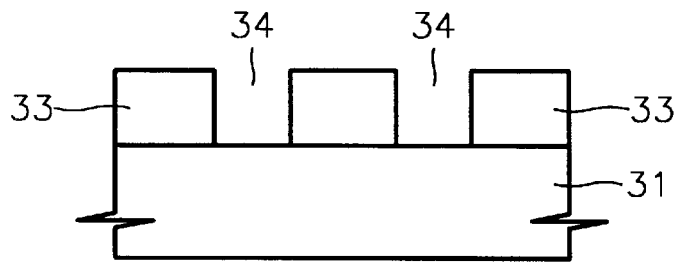
FIGS. 6 through 10 are sectional views of a semiconductor device for describing a method for manufacturing a capacitor of a semiconductor device according to the present invention shown in FIG. 4.

In FIG. 6, the first interlayer dielectric film pattern 33 having the first contact hole 34 is formed by forming an insulating film on the semiconductor substrate 31, for example, the silicon substrate, and patterning it.

Figure 7:
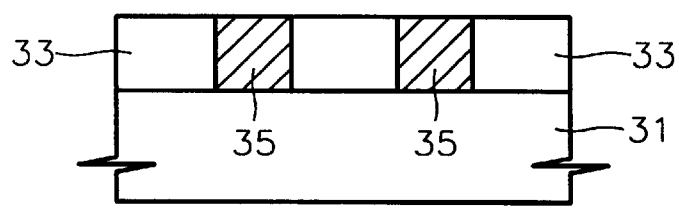

In FIG. 7, after forming a conductive film for the contact plug 35 on the substrate 31 on which the first contact hole 34 and the fist interlayer dielectric film pattern 33 are formed, the inside of the first contact hole 34 is buried by etching back or performing CMP (Chemical-Mechanical Polishing on the conductive film, and thus the contact plug 35 electrically connected to the semiconductor substrate 31 is formed. The contact plug 35 is formed of a polysilicon film, a silicon film, a tungsten film, a tungsten nitride film, or a titanium nitride film. An ohmic layer may be further formed on the contact plug in order to reduce resistance. A metal film having a high melting point such as Co and Ta, a metal nitride film, or a TiW film can be used as the ohmic layer.

Figure 8:
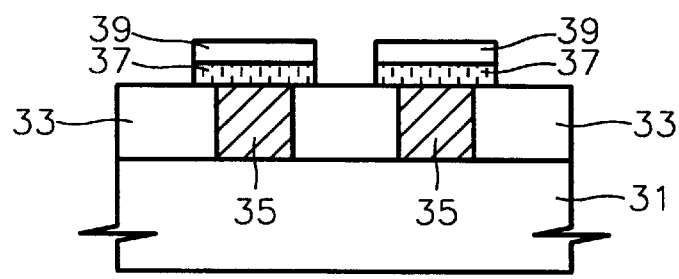

In FIG. 8, the diffusion barrier layer pattern 37 and the first conductive film pattern 39 are formed on the contact plug 35 by sequentially forming a diffusion barrier layer and a conductive film to have thicknesses of 300 to 500 Å and 500 to 1,500 Å on the overall surface of the resultant on which the contact plug film 35 is formed and patterning the diffusion barrier layer and the conductive film using a photolithography and etching processes. The diffusion barrier layer pattern 37 is formed of one selected from the group consisting of Ta, Ti, W, Co, Ir, Ru, TaSi, CoSi, $TiSi_x$, WSi, TiSiN, TaSiN, $IrO_2$, $RuO_2$, WN, TiN, TaN, TaAlN, and TiAlN. The first conductive film pattern 39 is comprised of a platinum group metal such as Pt, Ru, or Ir, a conductive platinum group oxide such as $IrO_2$ or $RuO_2$, or a conductor oxide including the platinum group metal and having a perovskite structure such as $SrRuO_3$, $CaSrRuO_3$, or $BaSrRuO_3$.

Figure 9:
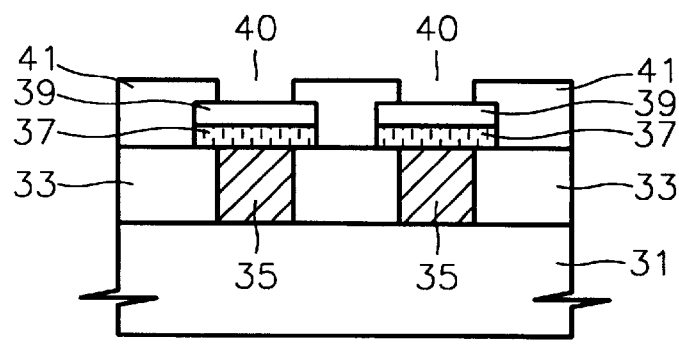

In FIG. 9, a second interlayer dielectric film pattern 41 having a second contact hole 40 exposing the surface of the first conductive film pattern 39 is formed by forming an insulating film on the overall surface of the substrate 31 so as to fill a space between the diffusion barrier layer pattern 37 and the first conductive film pattern 39 using a chemical vapor deposition (CVD) method, an LPCVD (low pressure CVD) method, or a PECVD (plasma enhanced CVD) method, and patterning the insulting film. The second interlayer dielectric film pattern 41 is formed of undoped silicate glass (USG), spin on glass (SOG), or boro phospho silicate glass (BPSG).

Figure 10:
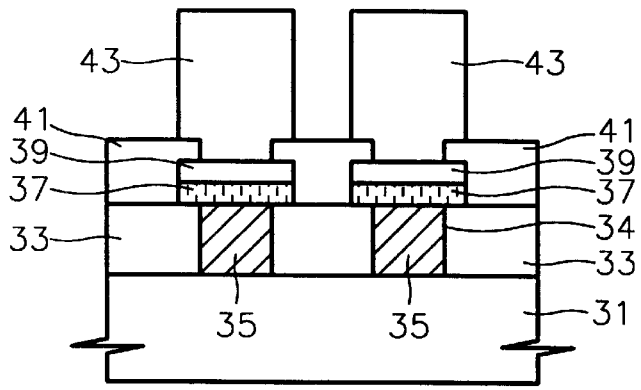

In FIG. 10, a second conductive film pattern 43 used as the lower electrode of the capacitor is formed on the first conductive film pattern 39 by forming a conductive film on the overall surface of the substrate 31, on which the first conductive film pattern 39 and the second interlayer dielectric film pattern 41 are formed, to have a thickness of 3,000 to 7,000 Å and patterning the conductive film. The second conductive film pattern 43 is comprised of a platinum group metal such as Pt, Ru, or Ir, a conductive platinum group oxide such are $IrO_2$ or $RuO_2$, or a conductive oxide including the platinum group metal and having a perovskite structure such as $SrRuO_3$, $CaSrRuO_3$, or $BaSrRuO_3$.

As shown in FIG. 4, a high dielectric film 45 is formed on the overall surface of the substrate 31 on which the second conductive film pattern 43 is formed. The high dielectric film 45 is formed of $Al_2O_3$, $Ta_2O_5$, $(Ba,Sr)TiO_3$, $BaTiO_3$, $SrTiO_3$, $PbTiO_3$, $PbTiO_3$, $Pb(Zr,Ti)O_3$, $(Pb,La)TiO_3$, $KNO_3$, or $LiNbO_3$. The high dielectric film 45 is formed by a sputtering method or a CVD method. The capacitor of the semiconductor device is completed by forming a third conductive film pattern 47 used as the upper electrode of the capacitor on the high dielectric film 45. The third conductive film pattern 47 is comprised of a platinum group metal such as Pt, Ru, or Ir, a platinum group oxide such as $IrO_2$ or $RuO_2$, a conductive oxide including the platinum group metal and having a perovskite structure such as $SrRuO_3$, $CaSrRuO_3$, or $BaSrRuO_3$ and having a perovskite structure, or a metal having a high melting point such as W or TiN.

Figure 11:
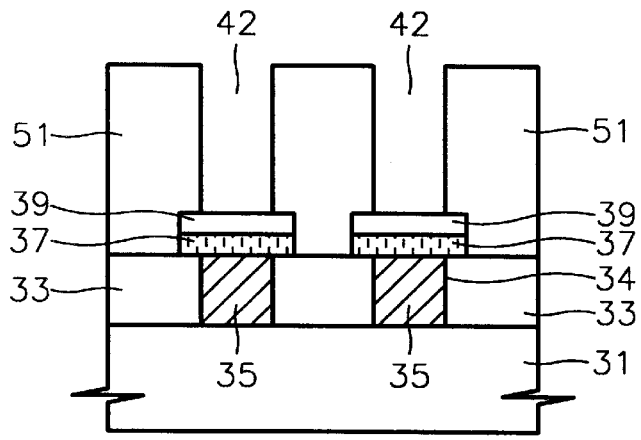
FIGS. 11 through 14 are sectional views of a semiconductor device for describing a method for manufacturing the capacitor of the semiconductor device according to the present invention shown in FIG. 5.
Figure 12:
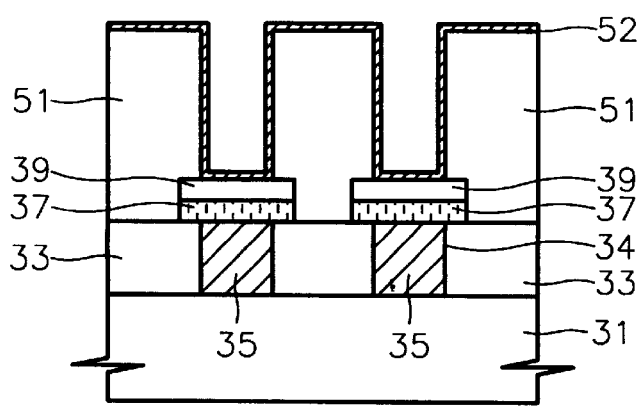
Figure 13:
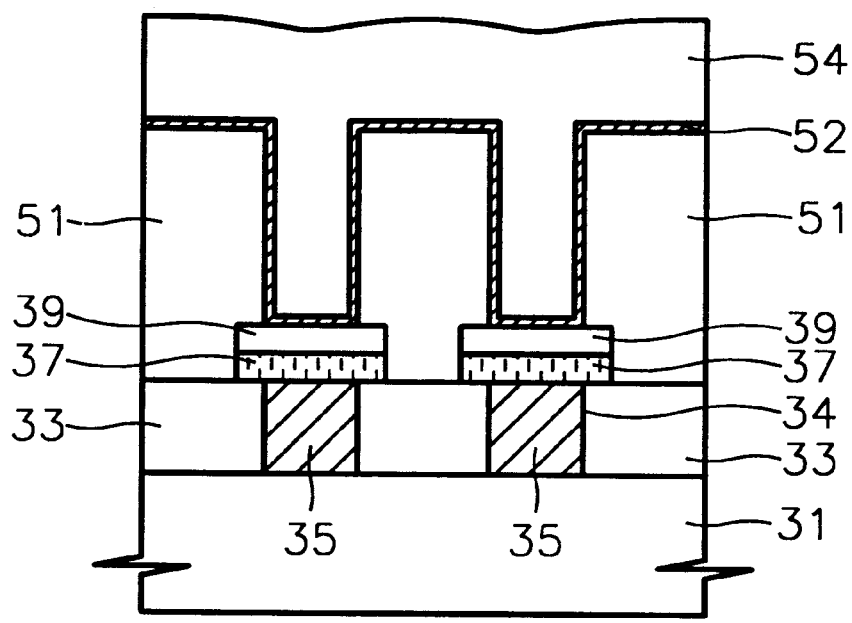

FIGS. 11 through 13 are sectional views of a semi conductor device for describing an example of a method for manufacturing the capacitor of the semiconductor device according to the present invention shown in FIG. 5.

To be specific, manufacturing processes described with reference to FIGS. 6 through 8 are proceeded. By doing so, the first interlayer dielectric film pattern 33, the contact plug 35, the diffusion barrier layer pattern 37 and the first conductive film pattern 39 are formed on the semiconductor substrate 31 as shown in FIG. 8.

Referring to FIG. 11, a second interlayer dielectric film pattern 51 having the second contact hole 42 exposing the first conductive film pattern 39 is formed by forming an insulating film on the overall surface of the substrate 31 on which the first conductive film pattern 39 is formed and patterning the insulating film. The second interlayer dielectric film pattern 51 is formed to be thicker than the second interlayer dielectric film pattern 41 shown in FIG. 9.

Referring to FIG. 12, a second conductive film 52 used as the lower electrode of the capacitor is formed to have a thickness of 50 to 500 Å on the overall surface of the substrate 31 on which the second interlayer dielectric film pattern 51 is formed. The second conductive film 52 is comprised of a platinum group metal such as Pt, Ru, or Ir, a conductive platinum group oxide such as $IrO_2$ or $RuO_2$, a conductive oxide including the platinum group metal and having a perovskite structure such as $SrRuO_3$, $CaSrRuO_3$, or $BaSrRuO_3$, or a metal having a high melting point such as W or TiN.

Referring to FIG. 13, a material film 54 filling the second contact hole 42 and formed of a photoresist film or an is formed on the overall surface of the substrate 31 on which the second conductive film 52 is formed.

Figure 14:
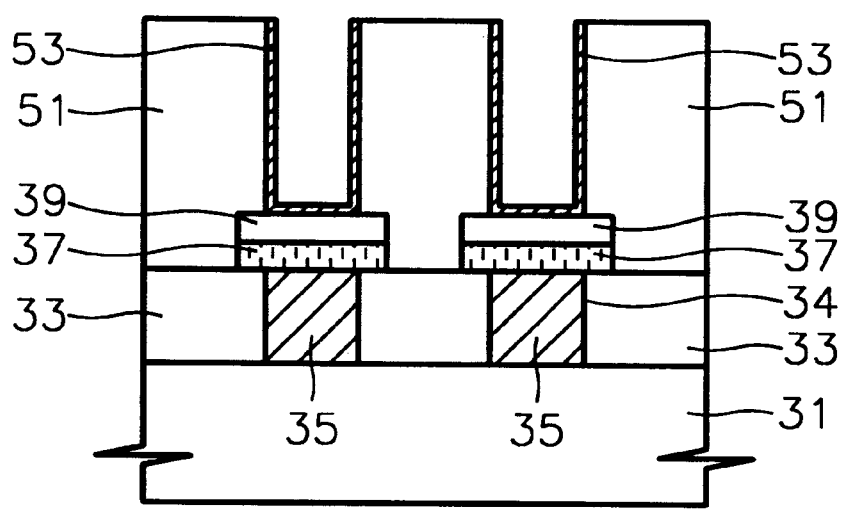

Referring to FIG. 14, a second conductive film pattern 53 for is formed by etching back or performing a CMP method on the material film 54 and the second conductive film 52 until the second interlayer dielectric film pattern 51 is exposed. Then, the material film 54 left in the second contact hole 42 is removed. By doing so, the second conductive film pattern 53 used as the lower electrode of the capacitor is formed on the inner wall of the second contact hole and on the first conductive film pattern 39.

When the second conductive film pattern 53 is formed by the CMP method, the material film 54 may not be used. Namely, when the CMP process is performed on the second conductive film 52 without forming the material film, the second conductive film pattern used as the lower electrode of the capacitor is formed on the inner wall of the second contact hole and on the first conductive film pattern 39.

As shown in FIG. 5, a high dielectric film 55 and a third conductive film pattern 57 used as the upper electrode 57 are formed on the second conductive constant material pattern 53. The high dielectric film 55 is formed of $Al_2O_3$, $Ta_2O_5$, $(Ba,Sr)TiO_3$, $BaTiO_3$, $SrTiO_3$, $PbTiO_3$, $PbTiO_3$, $Pb(Zr,Ti)O_3$, $(Pb,La)TiO_3$, $KNO_3$, or $LiNbO_3$. The third conductive film pattern 57 is comprised of a platinum group metal such as Pt, Ru, or Ir, a conductive platinum group oxide such as $IrO_2$ or $RuO_2$, a conductive oxide including the platinum group metal and having a perovskite structure such as $SrRuO_3$, $CaSrRuO_3$, and $BaSrRuO_3$ and, or a metal having a high melting point such as W or TiN.

According to the present invention, it is possible to prevent an increase of the contact resistance since the first conductive film pattern prevents the diffusion barrier layer pattern from oxidizing when the high dielectric film is used as the dielectric film of the capacitor.

The present invention is not restricted to the above embodiments, and it is clearly understood that many variations are possible within the scope and spirit of the present invention by anyone skilled in the art.

What is claimed is:

1. A capacitor of a semiconductor device, comprising:
   a first interlayer dielectric film pattern formed on a semiconductor substrate and having a first contact hole therethrough;
   a contact plug formed in the first contact hole and electrically connected to the semiconductor substrate;
   a diffusion barrier layer pattern formed on the contact plug;
   a first conductive film pattern formed on the diffusion barrier layer pattern;
   a second interlayer dielectric film pattern formed on the first interlayer dielectric film pattern and the first conductive film pattern, wherein the second interlayer dielectric film pattern comprises a second contact hole that exposes a top surface of the first conductive film pattern;
   a second conductive film pattern formed on the first conductive film pattern exposed through the second contact hole; and
   a dielectric film formed on the second conductive film pattern.

2. The capacitor of claim 1, wherein the diffusion barrier layer pattern is formed of a material selected from a group consisting of Ta, Ti, W, Co, Ir, Ru, TaSi, CoSi, $TiSi_x$, WSi, TiSiN, TaSiN, $IrO_2$, $RuO_2$, WN, TiN, TaN, TaAlN, and TiAlN.

3. The capacitor of claim 1, wherein the first conductive film pattern is formed of a material selected from a group consisting of a platinum group metal and conductive oxides of the platinum group metal.

4. The capacitor of claim 3, wherein the platinum group metal is one selected from a group consisting of Pt, Ru, and Ir, and the conductive oxides are selected form a group consisting of $IrO_2$, $RuO_2$, $SrRuO_3$, $CaSrRuO_3$, and $BaSrRuO_3$.

5. The capacitor of claim 1, wherein the contact plug is formed of a material selected from a group consisting of a polysilicon film, a silicon film, a tungsten film, a tungsten nitride film, and a titanium nitride film.

6. The capacitor of claim 1, wherein the dielectric film is formed of a material selected from a group consisting of $Al_2O_3$, $Ta_2O_5$, $(Ba,Sr)TiO_3$, $BaTiO_3$, $SrTiO_3$, $PbTiO_3$, $PbTiO_3$, $Pb(Zr,Ti)O_3$, $(Pb,La)TiO_3$, $KNO_3$, and $LiNbO_3$.

7. The capacitor of claim 1, wherein the second conductive film pattern is formed of a material selected from a group consisting of a platinum group metal and conductive oxides of the platinum group metal.

8. The capacitor of claim 1, wherein the second conductive film pattern covers the first conductive film pattern exposed through the second contact hole and inner walls of the second contact hole.

9. The capacitor of claim 1, further comprising an ohmic layer between the contact plug and the diffusion barrier layer.

10. The capacitor of claim 9, wherein the ohmic layer is formed of one selected from a group consisting of a metal film, a metal nitride film and a TiW film.

11. The capacitor of claim 1, further comprising a third conductive film formed on the dielectric film.

* * * * *

UNITED STATES PATENT AND TRADEMARK OFFICE
CERTIFICATE OF CORRECTION

PATENT NO.    : 6,239,461 B1
DATED         : May 29, 2001
INVENTOR(S)   : Byoung-taek Lee It is certified that error appears in the above-identified patent and that said Letters Patent is hereby corrected as shown below:

Column 1,
Line 22, delete "oxide" and insert -- oxides --;

Column 3,
Line 40, delete "conductor";

Column 4,
Line 19, delete "embodiment" and insert -- embodiments --;
Line 65, delete "conductor";

Column 6,
Line 46, delete "and" and insert -- or --;
Line 47, delete "or" and insert -- and --;
Line 62, delete "conductor" and insert -- conductive --;

Column 8,
Line 2, after "an" insert -- insulating film --;
Line 6, delete "for";
Line 31, delete "$CaSrRuO_3$, and" insert -- $CaSrRuO_3$ or --; and
Line 31, delete "and" after "$BaSrRuO_3$".

Signed and Sealed this

Tenth Day of December, 2002

JAMES E. ROGAN
*Director of the United States Patent and Trademark Office*